United States Patent
Kim

(10) Patent No.: US 7,211,498 B2
(45) Date of Patent: May 1, 2007

(54) METHOD OF MANUFACTURING AN ISOLATION LAYER OF A FLASH MEMORY

(75) Inventor: Dong-Oog Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,580

(22) Filed: Dec. 30, 2005

(65) Prior Publication Data

US 2007/0066030 A1    Mar. 22, 2007

(30) Foreign Application Priority Data

Sep. 20, 2005  (KR) .................... 10-2005-0087279

(51) Int. Cl.
*H01L 21/76* (2006.01)
(52) U.S. Cl. ................ 438/427; 438/296; 257/E21.546
(58) Field of Classification Search ................ 438/296, 438/424, 427, 694, 700, 723, 724, 221, 359, 438/717
See application file for complete search history.

(56) References Cited

U.S. PATENT DOCUMENTS 6,879,000 B2 * 4/2005 Yeo ............................ 257/347

2005/0142808 A1 * 6/2005 Otsuki ........................ 438/427
2005/0230780 A1 * 10/2005 Ito et al. ..................... 257/510

* cited by examiner

*Primary Examiner*—Quoc Hoang
(74) *Attorney, Agent, or Firm*—Lowe Hauptman & Berner LLP

(57) ABSTRACT

A method including forming a first mask material layer on a semiconductor substrate in order to mask a cell region and to not mask a peripheral circuit region. The method further includes forming a second mask material layer on an entire surface of the substrate in the cell region and peripheral circuit region, simultaneously forming a trench having a first depth in the cell region and a trench having a second depth in the peripheral circuit region, where the second depth is greater than the first depth. The method also includes filling an insulation layer into an entire surface of the substrate including trenches, planarizing the insulation material layer and the second mask material layer to a degree that the first mask material layer is exposed, and respectively forming an STI isolation layer in both the cell region and the peripheral circuit region by removing the first and second mask material layer.

18 Claims, 6 Drawing Sheets

METHOD OF MANUFACTURING AN ISOLATION LAYER OF A FLASH MEMORY

CROSS-REFERENCE TO RELATED APPLICATION

This application claims priority to and the benefit of Korean Patent Application No. 10-2005-0087279 filed in the Korean Intellectual Property Office on Sep. 20, 2005, the entire contents of which are incorporated herein by reference.

BACKGROUND OF THE INVENTION (a) Field of the Invention The present invention relates to a method of manufacturing a flash memory. More particularly, the present invention relates to a method of manufacturing an isolation layer of a flash memory, in which source resistance can be reduced by using an isolation layer having an STI (Shallow Trench Isolation) structure.

(b) Description of the Related Art

Generally, a NOR type of flash memory uses a common source scheme, and one source contact is formed per 16 cells.

In addition, an STI technique has recently been used for forming an isolation layer in a semiconductor device so as to reduce a cell size. Moreover, in the case of a flash memory having a scale of 0.35 µm or less, an SAS (Self Aligned Source) technique is used for reducing a gap between a gate and a common source line.

A method of manufacturing a flash memory using such STI and SAS techniques may be found in Korean Patent Publication No. 2004-60550.

FIG. 1A is a top plan view and FIG. 1B is a cross-sectional view showing a structure of a flash memory cell manufactured by STI and SAS techniques.

As shown in FIG. 1A and FIG. 1B, a common source region 12 is formed in a line shape by ion-implanting N-type dopants into a semiconductor substrate 10, which includes a plurality of STI isolation layers 14 formed in parallel with a bit line 18 and active regions formed between the STI isolation layers 14. Here, reference numerals 16 and 20 respectively denote a gate line and a contact electrode. However, since a line of the common source region 12 is formed in generally a square wave shape along surfaces of STI isolation layers 14 and active regions, source resistance of a flash memory cell may be significantly increased.

As shown in FIG. 2, the significant increase in source resistance is mainly caused because an actual surface resistance is formed over a wider area since the source resistance is formed along the trench surface of the STI isolation layer 14, and also because resistivity of a sidewall of the trench is high since a relatively small amount of dopant is implanted therein.

Moreover, it is notable that the trench depth of an STI isolation layer tends to be increased since a flash memory device uses a high internal voltage, and that, accordingly, the trench is formed with a smaller depth in a cell region than in a peripheral circuit region so as to prevent source resistance in the cell region from being affected by the increase in the trench depth.

However, according to a conventional method of manufacturing an STI isolation layer of a flash memory cell, a forming process of an etch mask and an etching process for trenches should be performed separately in order to form trenches having different depths on a cell region and a peripheral circuit region. Therefore, a manufacturing process may become complicated and manufacturing costs may also be increased.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a method of manufacturing an isolation layer of a flash memory having advantages of simultaneously forming trenches having different depths from each other by a single etching process for trenches. Since a height difference is created between a mask material layer in a cell region and a mask material in a peripheral circuit region, the trenches having different depths from each other can be simultaneously formed by a single etching process with the use of those mask material layers.

An exemplary embodiment of the present invention provides a method of manufacturing isolation layers having different depths in a flash memory including a cell region and a peripheral circuit region. The method includes: forming a first mask material layer on a semiconductor substrate in order to mask only the cell region; forming a second mask material layer on an entire surface of the substrate in the cell region and the peripheral circuit region; simultaneously forming a trench having a first depth in the cell region and a trench having a second depth in the peripheral circuit region by etching the second mask material layer and the substrate in the cell region and the peripheral circuit region, wherein the second depth is greater than the first depth; filling an insulation layer into an entire surface of the substrate including trenches; planarizing the insulation material layer and the second mask material layer to a degree that the first mask material layer is exposed; and respectively forming an STI isolation layer in both the cell region and the peripheral circuit region by removing the first and second mask material layers.

DETAILED DESCRIPTION OF THE EMBODIMENTS

Figure 1A:
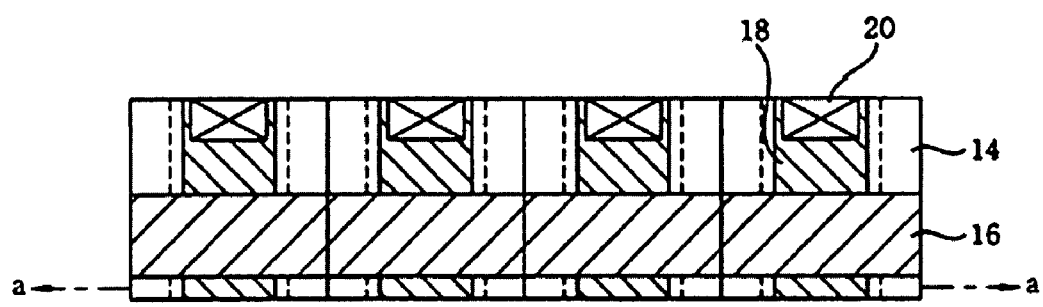
FIG. 1A is a top plan view and FIG. 1B is a cross-sectional view showing a structure of a flash memory cell manufactured by STI and SAS techniques.
Figure 1B:
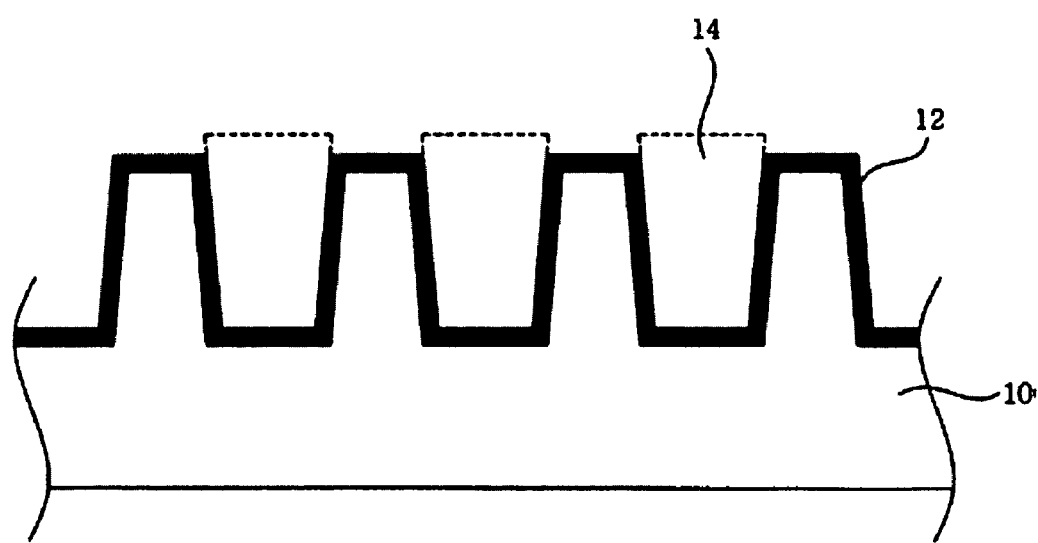
Figure 2:
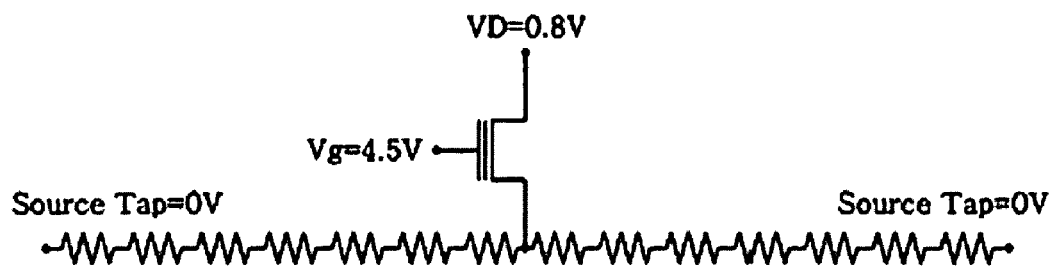
FIG. 2 is a circuit diagram showing source resistance of a flash memory cell having a common source line.

An exemplary embodiment of the present invention will hereinafter be described in detail with reference to the accompanying drawings, so that those skilled in the art to which the present invention belongs can practice the present invention easily. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Figure 3:
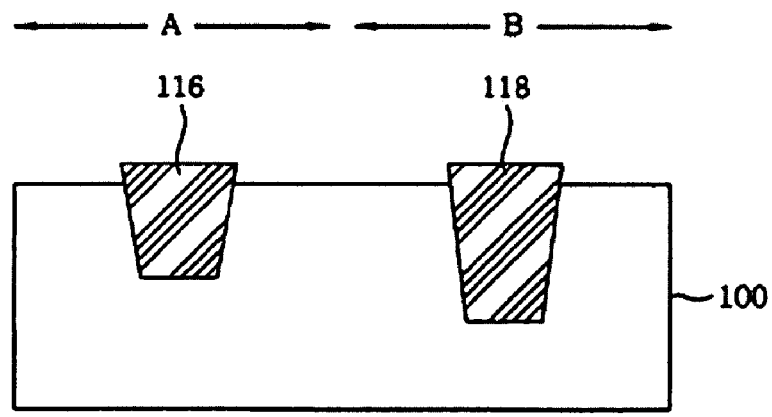
FIG. 3 is a cross-sectional view showing an STI isolation layer of a flash memory according to an exemplary embodiment of the present invention.

FIG. 3 is a cross-sectional view showing an STI isolation layer of a flash memory according to an exemplary embodiment of the present invention.

Referring to FIG. 3, a flash memory manufactured by an exemplary embodiment of the present invention includes an STI isolation layer 116 formed in a trench at a cell region (A) and an STI isolation layer 118 formed in a trench at a peripheral circuit region (B). The trench at the cell region (A) has a first depth of about 1000 Å–2000 Å, and the trench at the peripheral circuit region (B) has a second depth of about 3000 Å–4000 Å. Here, although not shown in the drawings, cell transistors of a flash memory, such as a gate and a source/drain regions, are formed in the cell region (A), and peripheral circuits required for operations of a flash memory are formed in the peripheral circuit region (B) which is located around the cell region (A).

Accordingly, since STI trenches are formed by a single etching process with the use of mask material layers having the height difference between the cell region (A) and peripheral circuit region (B), the STI isolation layers 116 and 118 having different trench depths from each other are respectively formed in the cell region (A) and peripheral circuit region (B).

Therefore, surface resistance of a common source region which is formed along the isolation layer 116 of the cell region (A) can be reduced because the depth of the STI isolation trench 116 in the cell region (A) is smaller than that of the STI isolation trench 118 in the peripheral circuit region (B). Consequently, efficiencies of reading and programming operation for a flash memory are enhanced.

FIG. 4A to FIG. 4H are cross-sectional views showing sequential stages of a method of manufacturing an STI isolation layer of a flash memory according to an exemplary embodiment of the present invention. A method of manufacturing an STI isolation layer of a flash memory according to an exemplary embodiment of the present invention will hereinafter be described in detail with reference to FIG. 4A to FIG. 4H.

Figure 4A:
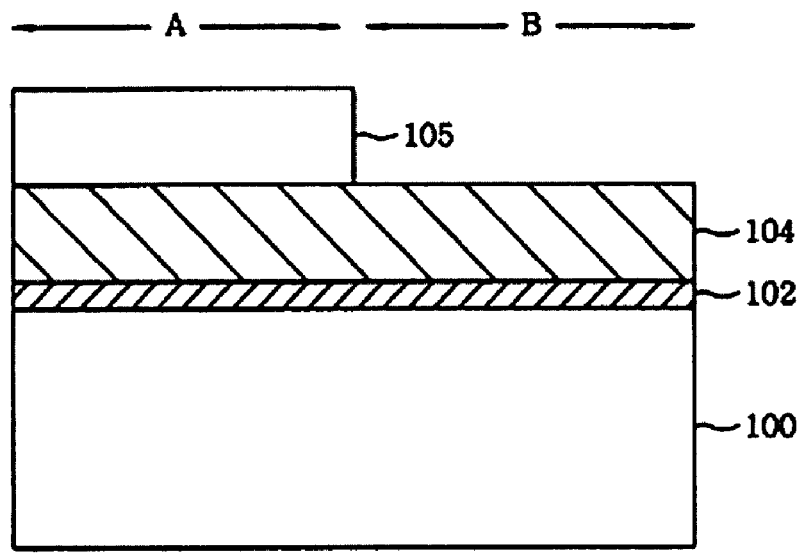
FIG. 4A to FIG. 4H are cross-sectional views showing sequential stages of a method of manufacturing an STI isolation layer of a flash memory according to an exemplary embodiment of the present invention.

As shown in FIG. 4A, a thin pad insulation layer 102 and a first mask material layer 104 are sequentially formed on a silicon semiconductor substrate 100 by performing a CVD (Chemical Vapor Deposition) process.

Here, the thin pad insulation layer 102 can be formed as a silicon oxide ($SiO_2$) layer with a thickness of about 50 Å. In addition, the first mask material layer 104 can be formed as a tetraethylorthosilicate (TEOS) layer with a thickness of about 1000 Å.

In addition, a photoresist is coated on the entire surface of the first mask material layer 104, and a photoresist pattern 105 is formed by performing an exposing and developing process with the use of a mask defining the cell region. Therefore, the photoresist pattern 105 is formed only on the first mask material layer 104 in the cell region (A) and not in the peripheral circuit region (B).

Figure 4B:
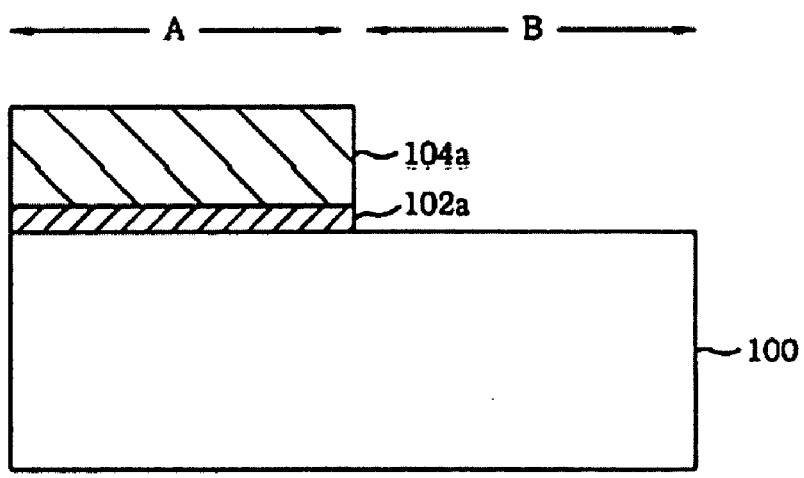

As shown in FIG. 4B, a surface of the semiconductor substrate in the peripheral circuit region (B) is exposed by patterning the first mask material layer 104 and the thin pad insulation layer 102 through a dry etching process using the photoresist pattern.

By performing such a patterning process, a first mask material layer pattern 104a and a thin pad insulation layer pattern 102a remain only on the surface of the semiconductor substrate 100 in the cell region (A). Subsequently, the photoresist pattern 105 is removed by performing an ashing process.

Figure 4C:
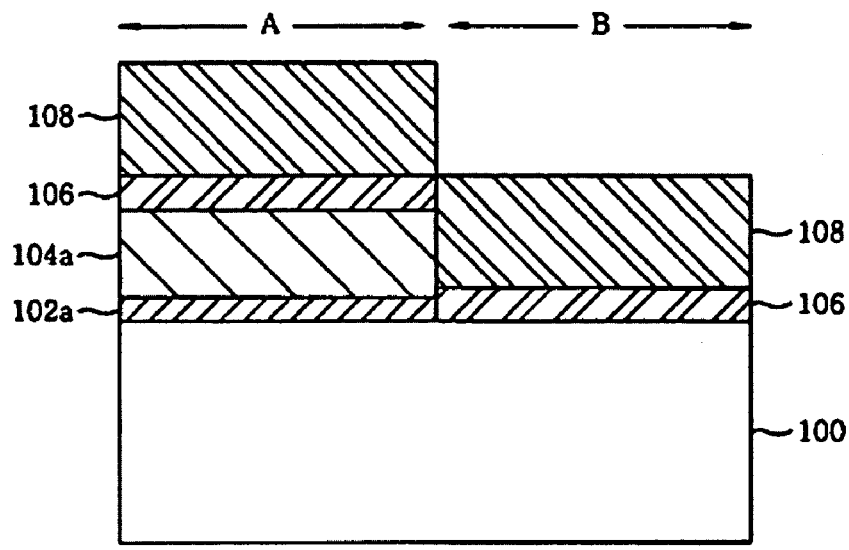

Thereafter, as shown in FIG. 4C, a second mask material layer 106, 108 is formed on the entire surface of the semiconductor substrate 100 in both cell region (A) and peripheral circuit region (B) by performing a CVD process. At this time, the second mask material layer 106, 108 is composed of at least one insulation layer, and according to an exemplary embodiment of the present invention, a silicon nitride ($Si_3N_4$) layer (108) having a thickness of about 1000 Å is formed on a TEOS layer (106) having a thickness of about 100 Å. Here, the second mask material layer 106, 108 is formed as at least two layers because the TEOS layer formed thinly on the semiconductor substrate performs a function of a thin pad insulation layer and the silicon nitride ($Si_3N_4$) layer formed on the TEOS layer performs a function of a mask material layer.

When the second mask material layer 106, 108 is deposited on the entire surface of the semiconductor substrate 100, a height difference between the cell region (A) and the peripheral circuit region (B) is created because the first mask material layer pattern 104a and the thin pad insulation layer pattern 102a still remain on the surface of semiconductor substrate 100 in the cell region (A).

Figure 4D:
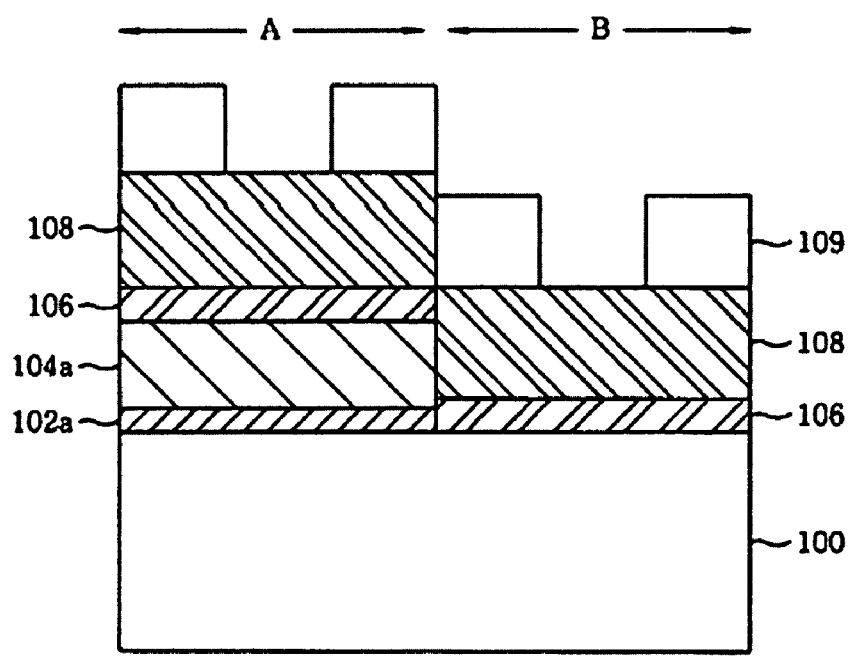

As shown in FIG. 4D, after deposing a photoresist on the entire surface of the semiconductor substrate including the second mask material layer 106, 108, a photoresist pattern 109 is formed by performing an exposing and developing process with the use of a mask defining an STI isolation layer region. Therefore, the photoresist pattern 109 is respectively formed on the second mask material layer 106, 108 in both the cell region (A) and the peripheral circuit region (B).

Figure 4E:
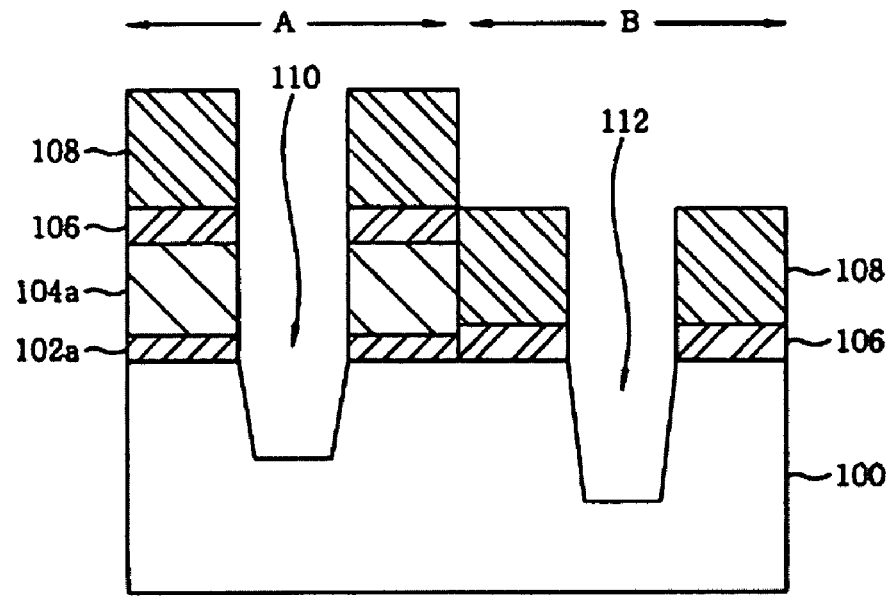

Subsequently, as shown in FIG. 4E, trenches 110 and 112 are simultaneously formed by a dry-etching process in the second mask material layer 106, 108 opened by the photoresist pattern to the predetermined depth of the semiconductor substrate. The trench 110 having a first depth is formed in the cell region (A), and the trench 112 having a second depth is formed in the peripheral circuit region (B). Here, the first depth of trench 110 is smaller than the second depth of trench 112. That is, the first depth of trench 110 is about 1000 Å–2000 Å, and the second depth of trench 112 is about 3000 Å–4000 Å.

As described above, the trench 112 in the peripheral circuit region (B) is etched more deeply than the trench 110 in the cell region (A) because the thickness of the mask material layer in the cell region (A) is different from that in the peripheral circuit region (B), and those mask material layers in both regions are used as an etch mask for forming trenches.

That is, while only the second mask material layer 106, 108 is deposited on the semiconductor substrate in the peripheral circuit region (B), the thin pad insulation layer 102a and the first mask material layer 104a are additionally deposited on the semiconductor substrate below the second mask material layer 106, 108 in the cell region (A).

Therefore, during a single etching process, the substrate in the peripheral circuit region (B) begins to be etched earlier than that in the cell region (A), since the height of the second mask material layer 106, 108 in the peripheral circuit region (B) is lower than that in the cell region (A). Consequently, the trench 112 in the peripheral circuit region (B) is etched more deeply than the trench 110 in the cell region (A).

Figure 4F:
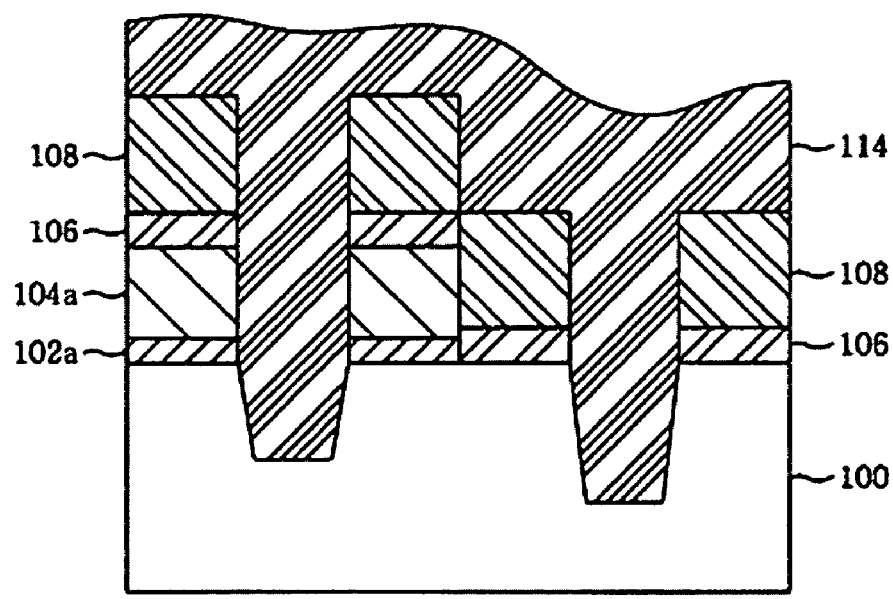
Figure 4G:
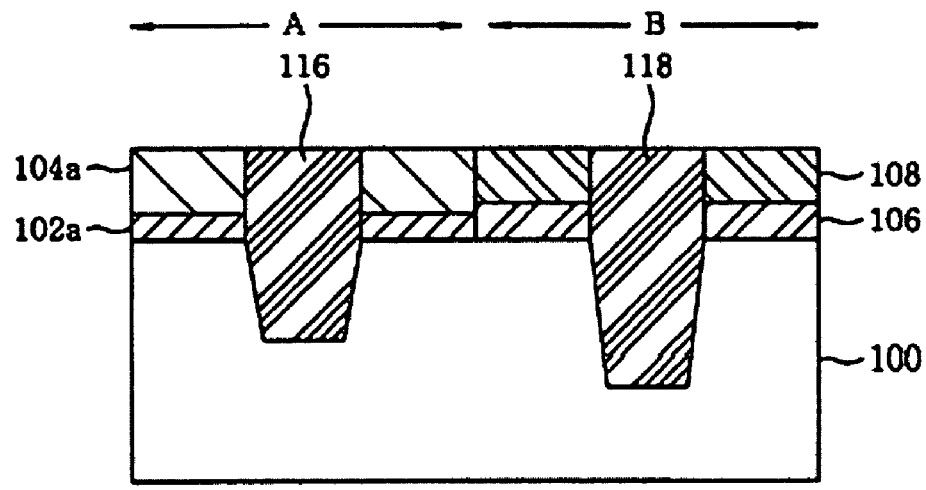

Subsequently, the photoresist pattern is removed by an ashing process. As shown in FIG. 4F and FIG. 4G, the trench 110 having the first depth and the trench 112 having the second depth are completely filled with an insulating material layer 114, such as a silicon oxide (SiO$_2$) layer, by depositing the insulating material layer 114 on the entire surface of the substrate with the use of a HDP (High Density Plasma) deposition process.

Subsequently, the second mask material layer 106, 108 is planarized by performing a CMP (Chemical Mechanical Polishing) process to a degree that the surface of the first mask material layer pattern 104a is exposed.

Here, the CMP process for planarizing the second mask material layer 106, 108 can be performed up to a predetermined level above the surface of the first mask material layer pattern 104a.

The height difference between the cell region (A) and the peripheral circuit region (B) is removed by such a planarization process, so the entire surface of the structure is uniformly planarized.

That is, the planarized first mask material layer pattern 104a and the thin pad insulation layer pattern 102a remain on the substrate in the cell region (A), and the second mask material layer 106, 108 having the same height as the planarized first mask material layer pattern 104a remain in the peripheral circuit region (B).

In addition, planarized silicon oxide layers are used for the STI isolation layers 116 and 118. The planarized silicon oxide layers fill trenches in the cell region (A) and peripheral circuit region (B), and their surfaces have the same height as the first mask material layer pattern 104a.

Subsequently, the first mask material layer pattern 104a and the thin pad insulation layer pattern 102a in the cell region (A), and the second mask material layer 106, 108 in the peripheral circuit region (B), are simultaneously removed by a wet etching process, etc.

Figure 4H:
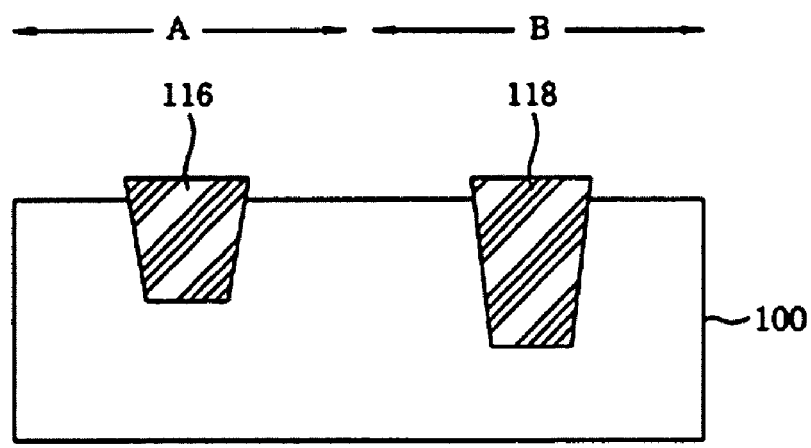

Therefore, as shown in FIG. 4H, the STI isolation layer 116 in the trench having the first depth, such as of 1000 Å–2000 Å, is formed in the substrate 100 at the cell region (A), and the STI isolation layer 118 in the trench having the second depth, such as of 3000 Å–4000 Å, is formed in the substrate at the peripheral circuit region (B).

Thereafter, although not shown in the drawings, cell transistors of a flash memory, such as a gate and a source/drain region, are formed in the cell region (A), and peripheral circuits required for operations of a flash memory are formed in the peripheral circuit region (B) which is located around the cell region (A).

Accordingly, since the depth of the STI isolation layer 116 formed in the cell region (A) is smaller than that of the STI isolation layer 118 in the peripheral circuit region (B), a common source region formed along the isolation layer 116 in the cell region (A) can have lower surface resistance.

As described above, according to an exemplary embodiment of the present invention, a mask material layer having a great height is formed on a semiconductor substrate in a cell region, and a mask material layer having a low height is formed on a semiconductor substrate in a peripheral circuit region.

Therefore, an STI isolation layer which has a lesser trench depth than that in the STI isolation layer in the peripheral circuit region can be formed in the cell region by a single etching process for forming STI trenches.

Consequently, since a single photoresist and trench etching process is performed for manufacturing STI isolation layers which have different trench depths from each other and which are simultaneously formed in the cell region and peripheral circuit region, the manufacturing process for STI isolation layers can be simplified, and the manufacturing costs can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A method of manufacturing isolation layers having different depths in a flash memory including a cell region and a peripheral circuit region, the method comprising:
    forming a first mask material layer on a semiconductor substrate in order to mask only the cell region;
    forming a second mask material layer on an entire surface of the substrate at the cell region whereon the first mask material layer is formed and the peripheral circuit region whereon the first mask material layer is not formed;
    simultaneously forming a trench having a first depth in the cell region and a trench having a second depth in the peripheral circuit region by etching the second mask material layer and the substrate in the cell region and the peripheral circuit region, the second depth being greater than the first depth;
    filling an insulation layer into the entire surface of the substrate including trenches;
    planarizing the insulation material layer and the second mask material layer to a degree that the first mask material layer is exposed; and
    respectively forming a shallow trench isolation (STI) layer in both the cell region and the peripheral circuit region by removing the first and second mask material layers,
    wherein the second mask material layer is formed to have a height difference between the cell region and the peripheral circuit region.

2. The method of claim 1, wherein a thin pad insulation layer is formed on the semiconductor substrate in the cell region before forming the first mask material layer.

3. The method of claim 2, wherein the thin pad insulation layer is a silicon oxide layer.

4. The method of claim 1, wherein the first mask material layer is a tetraethylorthosilicate (TEOS) layer.

5. The method of claim 1, wherein the second mask material layer is composed of at least one insulation layer.

6. The method of claim 1, wherein the second mask material layer is composed of a tetraethylorthosilicate (TEOS) layer and a silicon nitride layer.

7. The method of claim 5, wherein the second mask material layer is composed of a tetraethylorthosilicate (TEOS) layer and a silicon nitride layer.

8. The method of claim 1, wherein the first depth has a range from 1000 Å to 2000 Å, and the second depth has a range from 3000 Å to 4000 Å.

9. The method of claim 1, wherein the planarization process is performed by a chemical mechanical polishing process.

10. A method of manufacturing isolation layers having different depths in a flash memory including a cell region and a peripheral circuit region, the method comprising:

forming a first mask material layer on a semiconductor substrate in order to mask the cell region and to not mask the peripheral circuit region;

forming a second mask material layer on a surface of the substrate at the cell region whereon the first mask material layer is formed and the peripheral circuit region whereon the first mask material layer is not formed;

forming a trench having a first depth in the cell region and a trench having a second depth in the peripheral circuit region by etching the second mask material layer and the substrate in the cell region and the peripheral circuit region, the second depth being greater than the first depth;

filling an insulation layer into the surface of the substrate including trenches;

planarizing the insulation material layer and the second mask material layer to a degree that the first mask material layer is exposed; and respectively forming a shallow trench isolation (STI) layer in both the cell region and the peripheral circuit region by removing the first and second mask material layers, wherein the second mask material layer is formed to have a height difference between the cell region and the peripheral circuit region.

11. The method of claim 10, wherein a thin pad insulation layer is formed on the semiconductor substrate in the cell region before forming the first mask material layer.

12. The method of claim 11, wherein the thin pad insulation layer is a silicon oxide layer.

13. The method of claim 10, wherein the first mask material layer is a tetraethylorthosilicate (TEOS) layer.

14. The method of claim 10, wherein the second mask material layer is composed of at least one insulation layer.

15. The method of claim 10, wherein the second mask material layer is composed of a tetraethylorthosilicate (TEOS) layer and a silicon nitride layer.

16. The method of claim 15, wherein the second mask material layer is composed of a tetraethylorthosilicate (TEOS) layer and a silicon nitride layer.

17. The method of claim 10, wherein the first depth has a range from 1000 Å to 2000 Å, and the second depth has a range from 3000 Å to 4000 Å.

18. The method of claim 10, wherein the planarization process is performed by a chemical mechanical polishing process.

* * * * *